(12) United States Patent
Hertz et al.

(10) Patent No.: US 7,595,628 B1
(45) Date of Patent: Sep. 29, 2009

(54) PROBING APPARATUS FOR ILLUMINATING AN ELECTRICAL DEVICE UNDER TEST

(75) Inventors: Michael G Hertz, Washington Township, MI (US); Frederic Antonin, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 12/132,726

(22) Filed: Jun. 4, 2008

(51) Int. Cl.
*G01R 31/02* (2006.01)
(52) U.S. Cl. ...................... 324/72.5; 324/754
(58) Field of Classification Search .............. None
See application file for complete search history.

(56) References Cited

U.S. PATENT DOCUMENTS 4,859,932 A * 8/1989 Whitley ................ 324/72.5
5,672,964 A * 9/1997 Vinci .................... 324/72.5

* cited by examiner

*Primary Examiner*—Minh N Tang
(74) *Attorney, Agent, or Firm*—Gordon Kessler

(57) ABSTRACT

A probe for probing an electrical device under test is provided. The probe comprises a selectively positionable door defining a recessed compartment and a light source positioned within the recessed compartment. When the door is in a first position, the compartment is closed, and when the door is in a second position, the compartment is opened. When opened, the light source is reflected from a reflective surface of the door to illuminate a device being probed. The door may further comprise a magnifying element to allow for magnification of the area being probed by a user.

8 Claims, 7 Drawing Sheets

PROBING APPARATUS FOR ILLUMINATING AN ELECTRICAL DEVICE UNDER TEST

FIELD OF THE INVENTION

The present invention relates generally to electronic measurement instruments, and more particularly to instrument probes, which are able to physically or electronically connect to one or more nodes of an electrical circuit.

BACKGROUND OF THE INVENTION

Probes are well known devices which form an electrical path connecting one or more inputs of a test and measurement instrument to one or more nodes of a device under test. Probes traditionally consist of a conductive tip and an insulating probe body. The instrument operator will typically manually steady the insulating probe body while positioning the conducting probe tip to physically make contact with the surface of a conducting point on the device under test. When contact is made, the probe and channel termination form a connection to the circuit under test, allowing the test instrument to acquire and record signal information. Commonly, many nodes will be tested, and the operator will manually maneuver the probe tip to make contact with each of the desired nodes. In order to ensure that the probe tip has made contact with the proper node, and has not slipped off of the desired node, shorted two nodes together, or attached itself to another undesired node location, it is necessary for the operator to have accurate visual information about the probe tip's location relative to the desired node under test.

Currently, colored LEDs are available within active probes, for the purpose of probe identification. When connecting multiple probes to a device under test, users have historically been challenged when viewing the device under test, to identify which probe tip corresponds to which scope channel. Autocolor identification of probes has been implemented which illuminates a side panel of the probe with a color that matches a waveform trace color on an oscilloscope or other test and measurement apparatus for the corresponding channel. In this way, for example, if a channel 3 waveform trace in the oscilloscope grid appears blue, then the side panel of the probe acquiring the signals that are sent to the oscilloscope through channel 3 is lit with a blue LED. This prior art is useful for indicating the channel identity of the probe, but is not useful for illuminating or viewing the target node of the device under test. Currently, lighting and/or magnification of the target node of the device under test does not exist in probing technology.

SUMMARY OF THE INVENTION

The inventors of the present invention have noted that during the past several years, electrical device geometries and probing tip size have both continued to decrease. The ability for an instrument operator to manually position and re-position the probing tip to each desired node on the device under test has become increasingly challenging. Accurate probing is dependent on the operator's ability to visually locate the target node and the probe tip positions, and ensure that the correct contact has been made between the two. The potential for error while probing is a common concern. Specifically, adequate illumination and magnification of the probing contact point are needed.

In accordance with the present invention, a method and apparatus are provided for providing lighting and magnification of the point of interest while probing. The invention particularly removes the need for external sources of lighting and magnification. Rather, the probe functionality includes these necessary enhancements as part of the probe structure. Furthermore, indications of conductivity between a probe and a probed location may be provided.

It is therefore an object of the invention to provide a probe that improves over currently available devices.

Still other objects and advantages of the invention will in part be obvious and will in part be apparent from the specification and the drawings.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The invention will now be described, making reference to the accompanying drawings.

Figure 1:
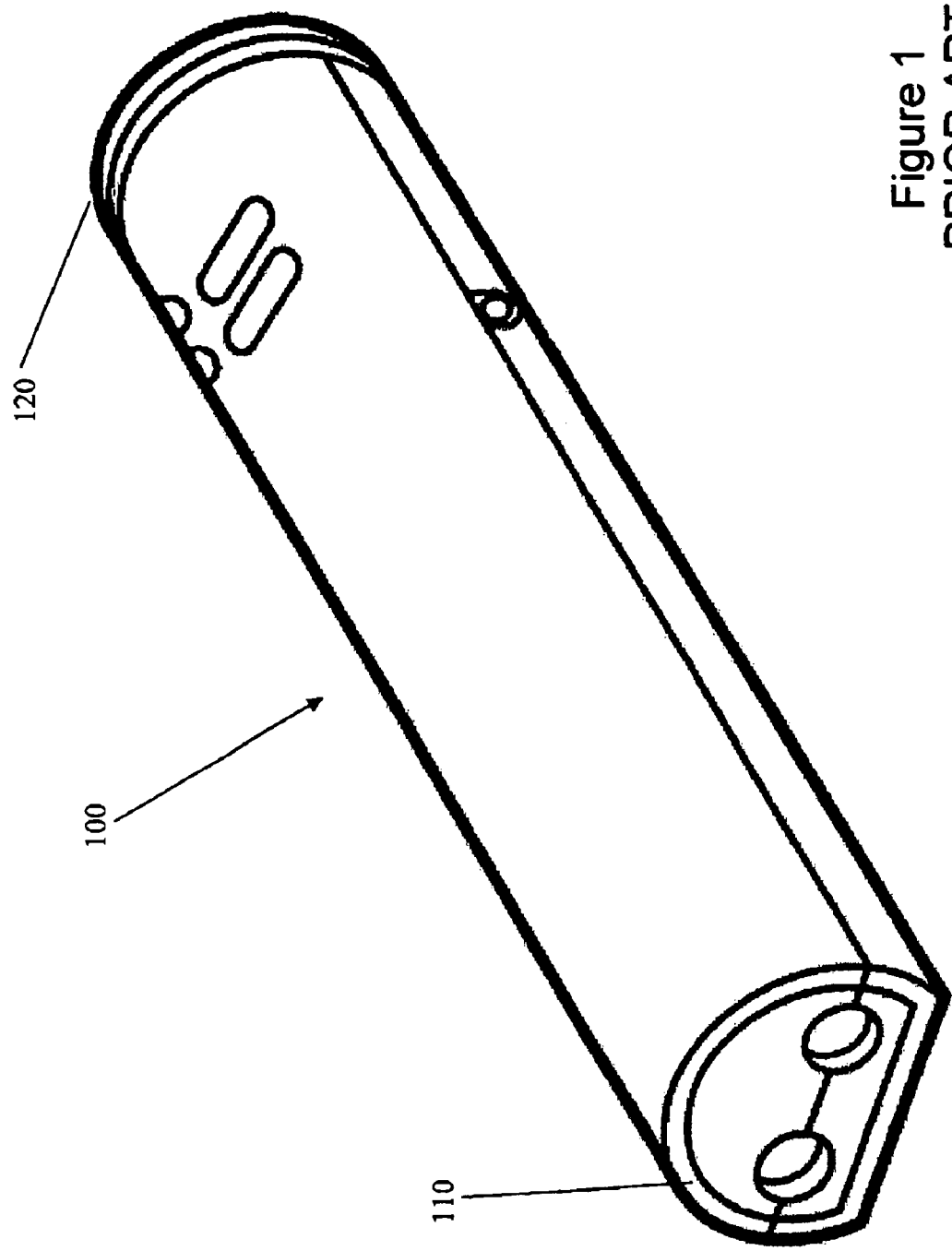
FIG. 1 is an illustration depicting an example of a traditional probe body.

Referring first to FIG. 1, a traditional probe body 100 is shown. Probe body 100 generally includes a proximal portion 110 for coupling with a probe tip used to contact a device under test, and a distal end 120 for coupling with a transmission cable for coupling the probe with a test and measurement apparatus. In the traditional probe body, no provisions for lighting or magnification are provided.

Figure 2:
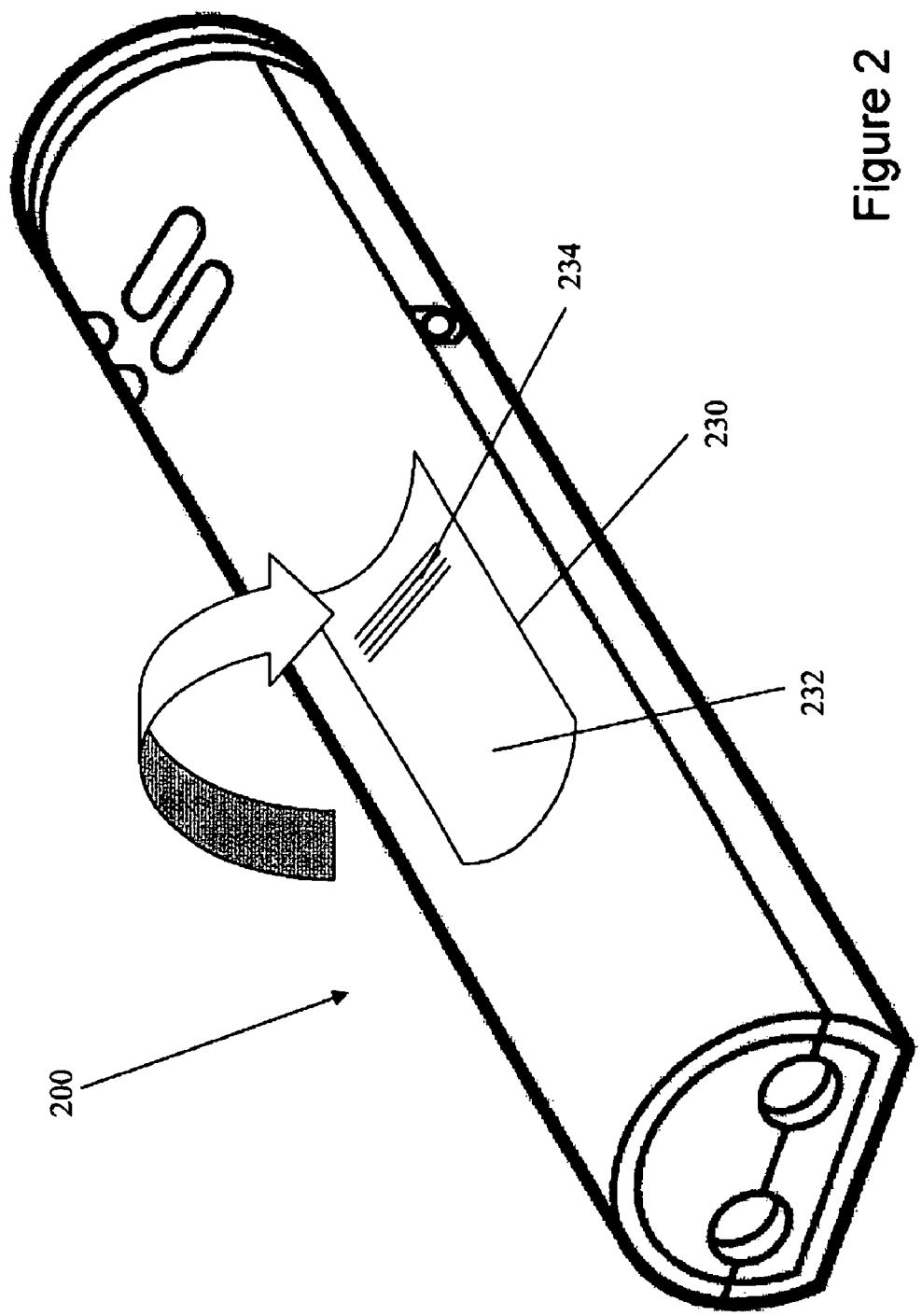
FIG. 2 is an illustration showing a recessed compartment within the probe body, which houses an illumination source, constructed in accordance with a first preferred embodiment of the invention.
Figure 3:
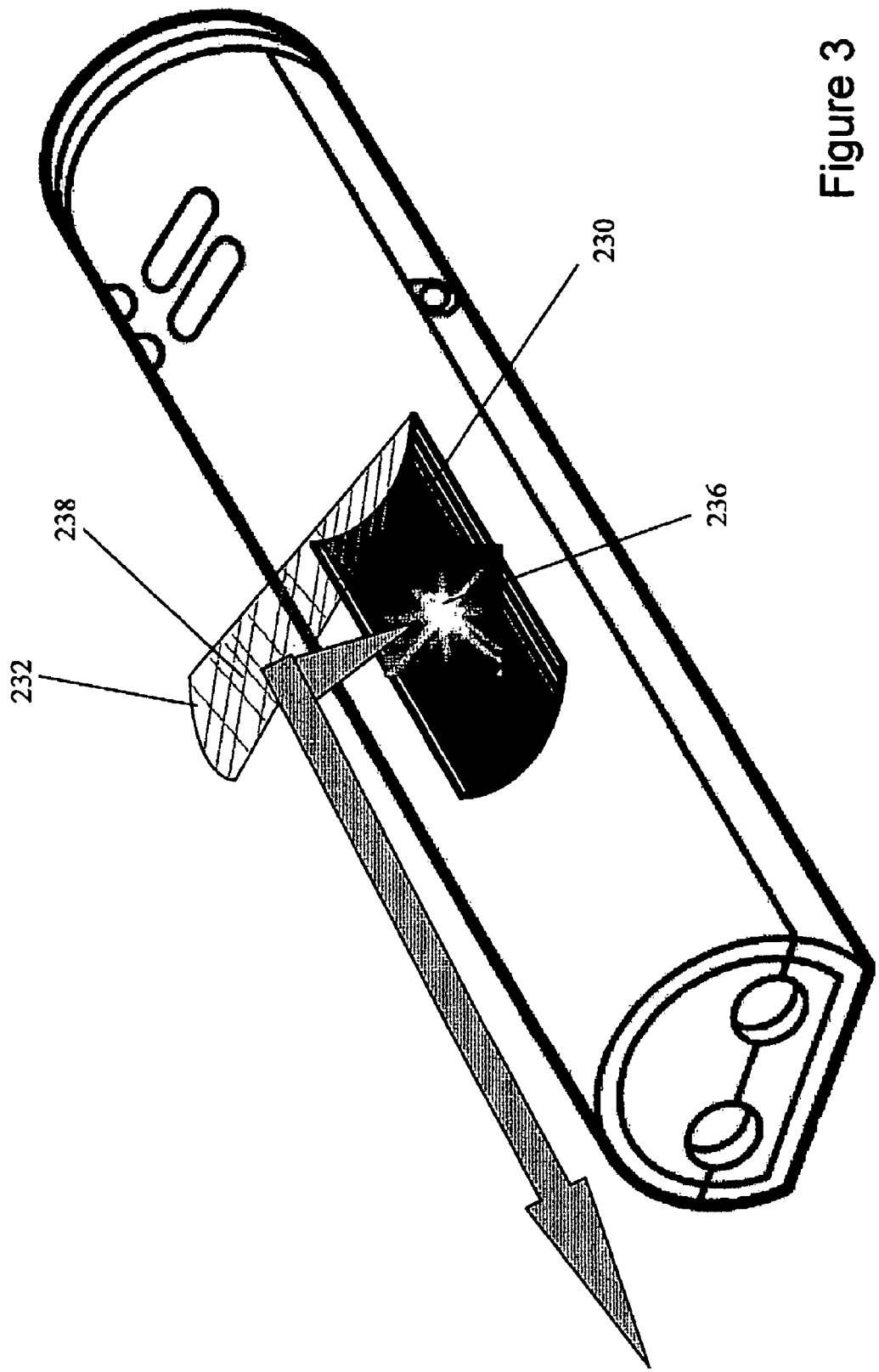
FIG. 3 is an illustration depicting the use of the first preferred embodiment of the invention, in which light reflects from a mirror, illuminating the device under test.

Referring next to FIG. 2, a probe 200 constructed in accordance with a first preferred embodiment of the invention is shown. A recessed compartment 230 within the probe body houses an illumination source, and is covered by a door 232. By applying thumb (or other) pressure to a predetermined portion 234 of door 232, the door snaps open to reveal (for example) a white LED 236, as shown in FIG. 3. A reflective surface 238 on the inside of door 232 (for example) allows the light from the LED to reflect forward, directing the focal point of the light to the tip of the probe, and thereby preferably illuminating the device under test at a point a user wishes to contact with the probe. In an alternative embodiment, rather than providing a reflective surface, upon opening of the door, it would be possible to reposition the LED to provide light directly to the tip of the probe. The white LED may also be substituted with a multiple color LED, thus providing visual feedback to a user regarding various states of the system. A different color may be used when the probe tip is in electrical contact with a probing node, etc. Different colors may be used to indicate the level of a probed signal, or even to remind a user to which channel of the test and measurement apparatus the probe is connected. this may be particularly beneficial when a number of probes connected to a number of different channels are used together. Other uses for such a colored LED are also possible.

Figure 4:
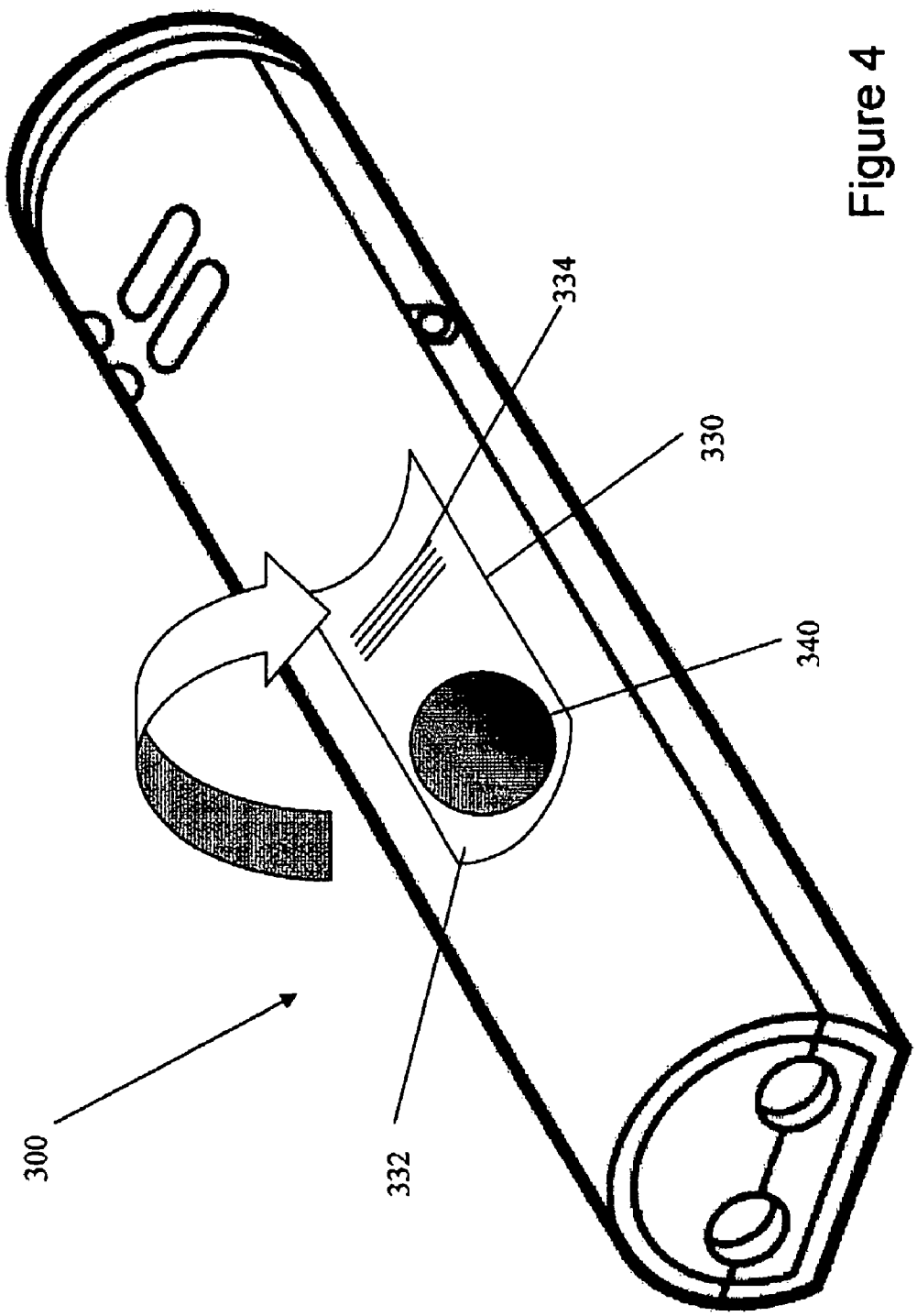
FIG. 4 is an illustration showing a recessed compartment within the probe body, which houses the magnification source, constructed in accordance with a second preferred embodiment of the invention.
Figure 5:
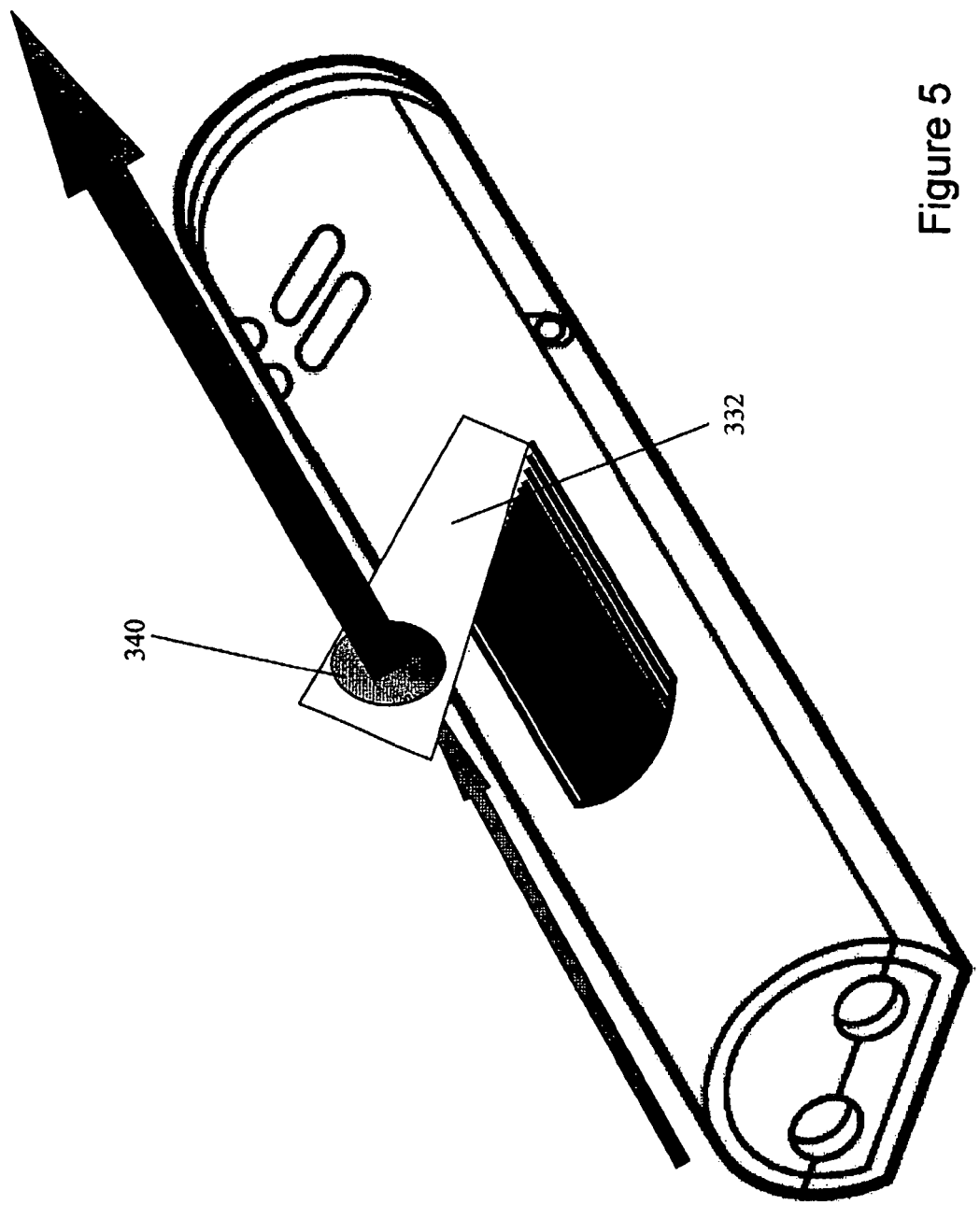
FIG. 5 is an illustration depicting use of the second preferred embodiment of the invention, in which the probing field of view is magnified.

Referring next to FIG. 4, a second preferred embodiment of the invention is shown. In this embodiment a probe 300 includes a recessed compartment 330 within the probe body is covered by a door 332. Door 332 in turn comprises a portion 334 indicated to receive pressure to move the door, and a recessed magnifier 340, which when in use improves visibility of a probed node. Recessed compartment 330 need only be deep enough to house magnifier 340, and to allow for the movement of the door between the first and second position. It would be possible to provide a design where the compartment was very shallow, perhaps only accommodating the thickness of the door. When thumb or other pressure is imparted to portion 334 of door 330, door 332 of recessed compartment 330 snaps open to reveal magnifying lens 340. As is shown in FIG. 5, when in use, light is magnified by the lens. With the magnifier extended into the viewing position, the view of the device under test is magnified, providing a magnified view of the device under test for the probe operator. A lighting element similar to that described above with respect to FIGS. 2 and 3 may be included in compartment 330, and may be used in conjunction with recessed magnifier 340.

Figure 6:
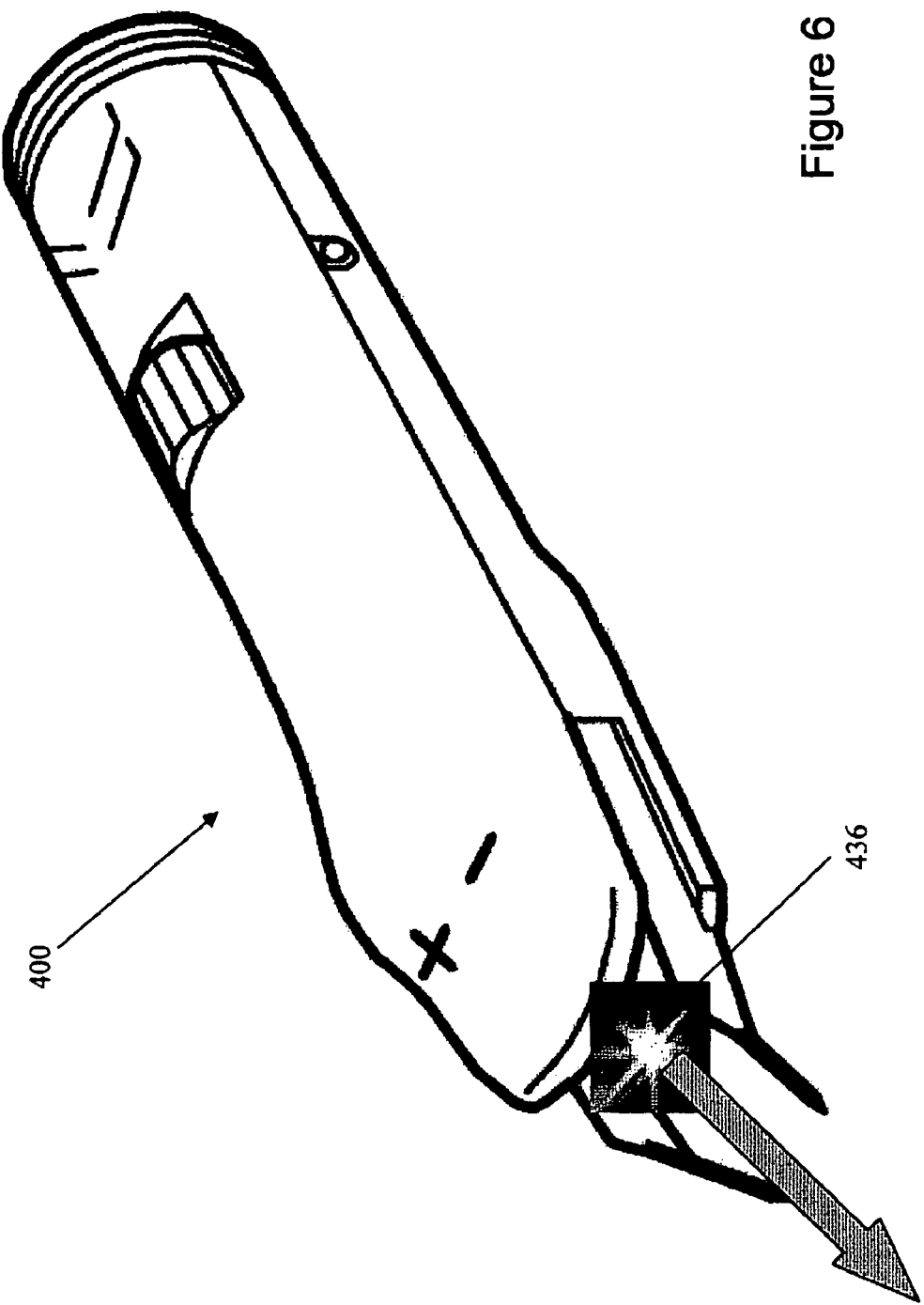
FIG. 6 is an illustration depicting a third preferred embodiment of the invention, in which the device is illuminated from a light source emanating directly from the head of the probe.

Referring next to FIG. 6, a white LED 436 is affixed directly on the tip of a probe 400. This white LED at the probe tip directly illuminates the probed node. Because the light beam emanating from the head of the probe is already focused in the direction of the probed node, no reflective mechanism is required. The white LED may also be substituted with a multiple color LED, thus providing visual feedback to a user regarding various states of the system. A different color may be used when the probe tip is in electrical contact with a probing node, etc. Different colors may be used to indicate the level of a probed signal, or even to remind a user to which channel of the test and measurement apparatus the probe is connected. This may be particularly beneficial when a number of probes connected to a number of different channels are used together. Other uses for such a colored LED are also possible.

Figure 7:
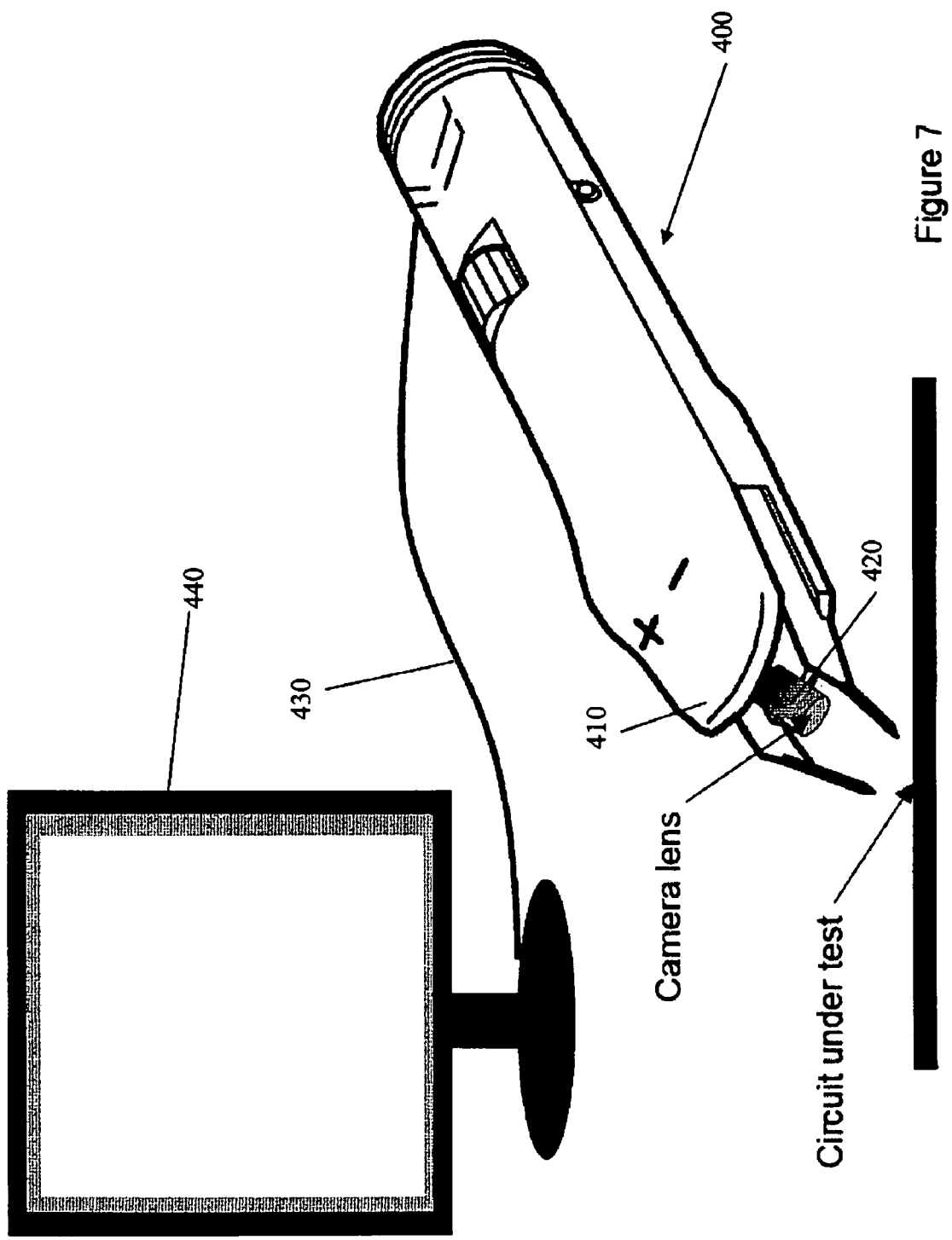
FIG. 7 is an illustration depicting a fourth preferred embodiment of the invention in which a camera is mounted to the probe body.

Referring next to FIG. 7 an additional alternative embodiment of the invention is shown. In this embodiment of the invention, a miniature camera 420 (which could include for example, a miniaturized fiber optic camera lens) is embedded within a probe body 400, a proximal portion 410 thereof for coupling with a probe tip used to contact a device under test. A cable 430 connects the probe with an external viewing monitor 440. This electronic connection may also be made wirelessly, for example with a Bluetooth personal area network or the like. Monitor 440 shows a magnified streaming view from the camera lens. The camera may also be mounted in other positions, including fixed to probe body 400 in any other desirable location. Also, multiple cameras may be used with the probe for example to show a top view and a side view, or to show the circuit-probe tip connection from two or more viewing angles as desired by the user.

While in each of the embodiments the light source, magnification element, LED or camera have been described in a particular manner (i.e. recessed, etc., these components may be fixed to the probe body in any other manner, such as a spotlight, fixed to the side of the probe body, or in a removable manner in which one or more mounting systems may be provided for mounting one or more of the above noted elements.

It will thus be seen that the objects set forth above, among those made apparent from the preceding description, are efficiently attained and, since certain changes may be made in the above construction(s) without departing from the spirit and scope of the invention, it is intended that all matter contained in the above description or shown in the accompanying drawing(s) shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A probe for probing an electrical device under test, comprising:
   a selectively positionable door defining a recessed compartment;
   a light source positioned within the recessed compartment; and
   a reflective surface on an internal surface of the door, the reflective surface being configured to focus light emitted from the light source to illuminate the electrical device under test;
   whereby when the door is in a first position, the compartment is closed, and when the door is in a second position, the compartment is opened and light from the light source illuminates the electrical device under test.

2. The probe of claim 1, wherein the reflected light source illuminates an area about the tip of the probe.

3. The probe of claim 1, wherein the light source is activated upon the positioning of the door in the second position.

4. The probe of claim 1, wherein the light source is an LED.

5. The probe of claim 4, wherein a color of the LED indicates a state of the probe.

6. The probe of claim 5, wherein at least one LED color indicates electrical contact with a device under test.

7. The probe of claim 1, further comprising:
   a magnifying element positioned within the door.

8. The probe of claim 7, wherein when the door is in the second position, light from the probe is magnified for a probe operator.

* * * * *